United States Patent [19]

Tin

[11] 4,370,620
[45] Jan. 25, 1983

[54] EFFICIENT HIGH PERFORMANCE ENVELOPE DETECTOR WITH CONTROLLED DECAY ENVELOPE DETECTION

[75] Inventor: Lucas K. Tin, Fremont, CA

[73] Assignee: Ampex Corporation, Redwood City, Calif.

[21] Appl. No.: 201,851

[22] Filed: Oct. 29, 1980

[51] Int. Cl.³ .................. H03D 1/10; H03D 1/18
[52] U.S. Cl. .................... 329/192; 307/351; 307/358; 329/204; 329/206; 360/29; 455/337
[58] Field of Search ............. 329/178, 192, 203, 204, 329/205 R, 206; 307/351–353, 358; 328/150, 151; 455/337; 360/29, 38

[56] References Cited

U.S. PATENT DOCUMENTS

| | | | |
|---|---|---|---|
| 4,001,702 | 1/1977 | Kaufman | 329/205 R X |
| 4,143,330 | 3/1979 | Nagasawa | 329/205 R X |
| 4,258,327 | 3/1981 | Fujimoto | 329/192 X |

Primary Examiner—Siegfried H. Grimm
Attorney, Agent, or Firm—George B. Almeida; Joel D. Talcott

[57] ABSTRACT

In this controlled decay envelope detector, a capacitor is used to hold the momentary peaks of the input signal. Its only discharge current path is controlled by a circuit which simultaneously monitors the capacitor voltage and the input signal such that the discharge current from the capacitor is proportional to the voltage difference between the capacitor voltage and a conventional exponential RC decay voltage provided in the control circuit. The resulting discharge from the capacitor, in response to a negative-going step input voltage, is an increasing current starting from zero at the time of the transient. The resulting detector output describes an upwardly convexing voltage decay curve which holds its level essentially equal to that of the initial peak input voltage until the next estimated peak input occurs. Only when the next peak input does not come, or is lower than the last one, will the output start dropping at an increasing rate, which provides a correspondingly precise detection of the envelope.

9 Claims, 7 Drawing Figures

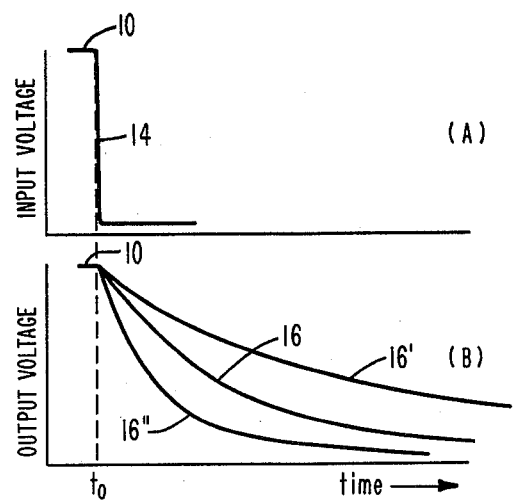
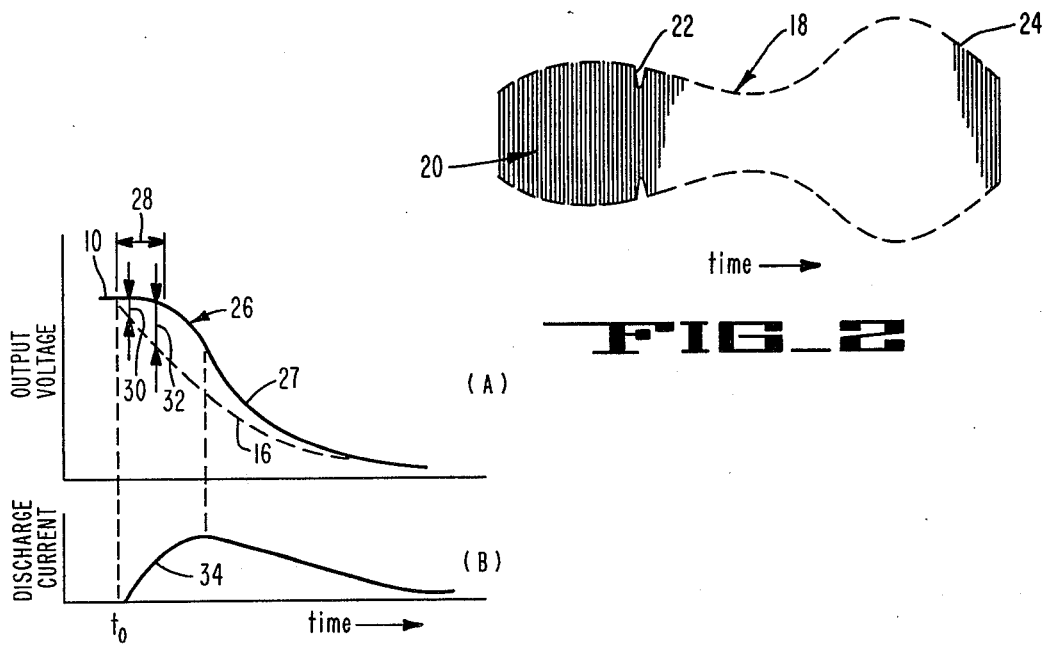
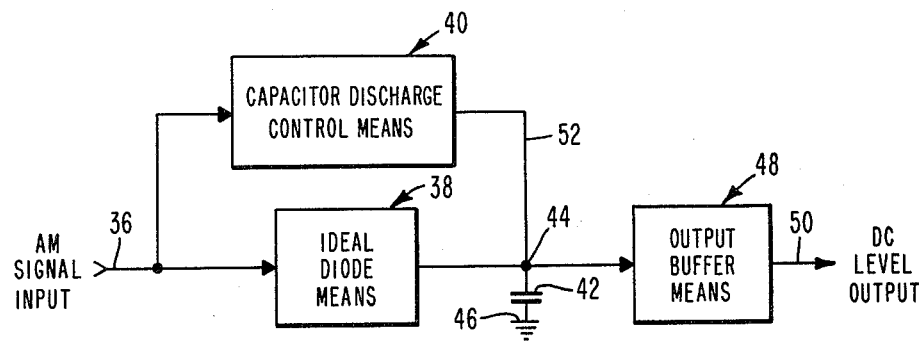

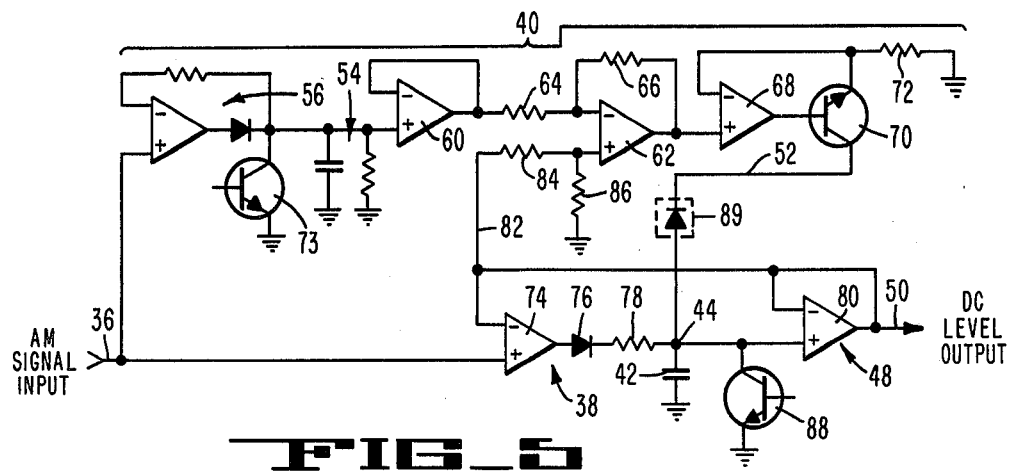
FIG_5
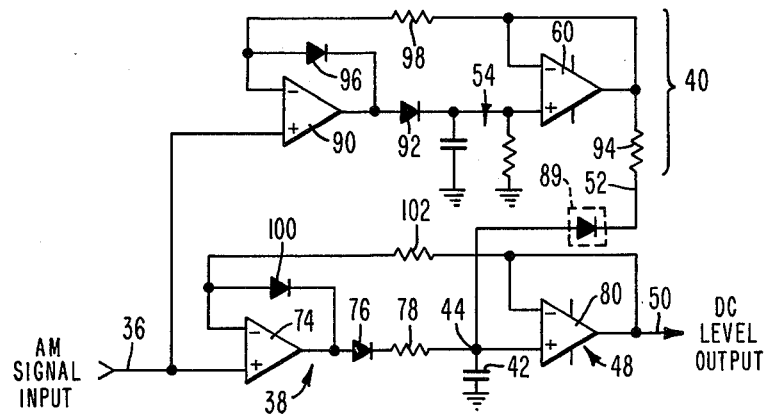
FIG_6
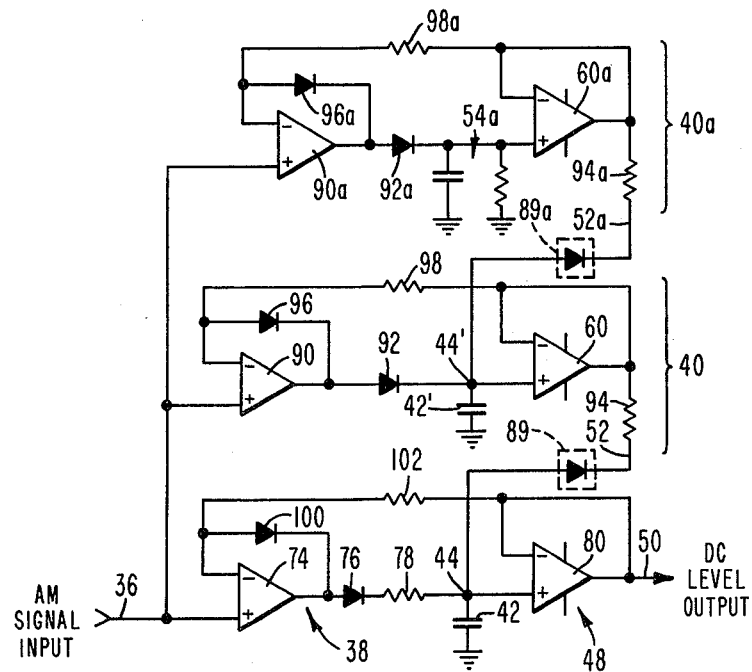
FIG_7

EFFICIENT HIGH PERFORMANCE ENVELOPE DETECTOR WITH CONTROLLED DECAY ENVELOPE DETECTION

BACKGROUND OF THE INVENTION

The invention relates to envelope detectors and, more particularly, to a high performance envelope detector which provides controlled decay envelope detection.

Typically, classic envelope detectors employ diodes and RC networks to obtain a DC voltage level that represents a congregation of the momentary peak amplitudes of an amplitude modulated (AM) signal. The response of such detectors to a negative-going voltage pulse conforms to the response of an RC network, i.e., is an exponential decay voltage curve. The degree or rate of decay depends upon the RC time constant and thus may be selected to provide a faster or slower decay, as desired.

Envelope detector circuits are variously used in many electrical systems, to detect the DC voltage level that represents the peak amplitudes of a corresponding signal. For example, in professional audio tape recorders, envelope detector circuits are used to obtain a constantly varying DC level corresponding to the amplitude of the envelope of an amplitude modulated reproduced signal. The DC level is used in the signal processing automation circuits of the recorder such as in automatic biasing and equalization checking circuits.

As is commonly known, tape dropouts occur when recording signals on magnetic tape medium due to scratches and dirt on the tape, head-to-tape conditions, etc., which dropouts in effect define a loss of signal, i.e., a negative change in the DC level of the envelope. It is not desirable to detect the DC level change due to dropouts, since they do not represent the true DC signal level and will cause an error in the measured signal and thus in the subsequent processed signal.

In the prior art envelope detectors of previous mention, the response of the detector is slowed by selecting the proper RC time constant, whereby the dropouts are not detected. However, then the detector also fails to respond to the faster envelope DC level changes. Conversely, if the detector is fast enough to respond to, and thus correctly detect, the faster envelope DC level changes, then it will also detect the unwanted changes caused by the dropouts. In addition, the faster envelope detector also generates a DC signal with a more pronounced stepped effect corresponding to each momentary peak of the AC carrier signal.

SUMMARY OF THE INVENTION

The invention provides an improved high performance envelope detector which overcomes the various shortcomings of the prior art detectors of previous mention. To this end, an input voltage signal, corresponding to an amplitude modulated carrier, is fed to capacitor means to charge same to an initial input voltage at each momentary peak of the signal, and to an RC network for generating an exponential decay voltage from a negative-going cycle of the input voltage signal. Capacitor discharge control means, responsive to the voltage difference between the exponential decay voltage and the capacitor voltage, controls the discharge of the capacitor means via an increasing discharge current. The resulting envelope detector output voltage decays in the form of an upwardly convexing, i.e., "convex upward," curve. Thus the output voltage level is held within a preselected percentage of the initial input voltage level for a selectable period of time. In the example herein, the period selected is longer than the expected worst dropout interval. Thereafter, the output voltage level then follows approximately the usual exponential decay curve.

In one embodiment, the capacitor discharge control means includes a difference amplifier and current drain means, which are used to generate the voltage difference between the exponential decay voltage and the initial input voltage, and to provide the increasing discharge current. The increasing discharge current controls the capacitor discharge to generate the convex upward output voltage decay for a time period longer than the worst expected dropout interval.

In an alternative embodiment, a resistor placed in the capacitor discharge path replaces the difference amplifier and the current drain means of the capacitor discharge control means, and provides the voltage difference and the increasing discharge current for controlling the discharge of the capacitor means to provide the convex upward output voltage decay.

Accordingly it is an object of the invention to provide a simple yet high performance detector circuit for precisely detecting the DC level of an amplitude modulated signal.

It is another object of the invention to provide a high performance envelope detector with tape dropout compensation.

Another object is to provide a general use envelo detector which generates a "convex upward" decay voltage output rather than the "concave upward" exponential decay of a conventional envelope detector.

A further object is to provide an envelope detector which generates a convex upward decay voltage which essentially holds the output voltage level within a selectable percentage of the initial input voltage level, for a given period of time such as, for example, longer than the worst expected tape dropout interval.

BRIEF DESCRIPTION OF THE DRAWINGS

FIG. 1 shows graphs depicting a negative-going step voltage as an initial input signal and a family of exponential decay curves which define the response of a prior art envelope detector.

FIG. 2 is a graph of a portion of an amplitude modulated AC carrier signal depicting the effects of a tape dropout.

FIG. 3 shows graphs depicting the curve of an increasing discharge current, and the corresponding convex upward decay curve which defines the response of the envelope detector of the invention combination.

FIG. 4 is a block diagram of the invention combination.

FIG. 5 is a schematic diagram of one implementation of the invention combination depicted in FIG. 4.

FIGS. 6 and 7 are schematic diagrams of alternative implementations of the combination of FIG. 4.

DESCRIPTION OF THE EMBODIMENTS

Referring to FIG. 1, the classic prior art envelope detector includes a resistor/capacitor (RC) circuit, wherein the capacitor is charged to an initial input level 10 employed here for purposes of comparing the prior art of FIG. 1 with the invention of FIG. 3. Upon initating a negative-going edge 14, the capacitor discharges in a typical exponential decay curve 16, wherein the slope of the decay is determined by the time constant of the RC circuit. That is the rate of decay, and thus the response speed of the detector, (curves 16' and 16") is determined by the values of the RC components.

In tape recording/reproducing apparatus, the varying envelope, i.e., the changing DC level of an amplitude modulated AC signal 20, FIG. 2, is detected for subsequent signal processing. However, tape dropouts likewise cause the envelope level to change as depicted at 22. This causes an error in the true envelope level and thus an error in the subsequent signal processing. It follows, if the response of the classic envelope detector is slowed to prevent it from detecting the dropout 22, then the detector also will not respond to the faster envelope changes such as that depicted at 24. Conversely, if the envelope detector response is made fast enough to detect the faster envelope level changes, it will also detect the undesired envelope changes caused by dropouts.

The envelope detector described herein compensates for dropouts while still providing the fast response required to detect even the fastest changes in envelope DC levels. The circuit furthermore more precisely reproduces the envelope level changes; that is, the circuit not only faithfully reproduces the decreasing envelope levels, but also generates a more gradually stepped, i.e., smoothed, curve to more faithfully reproduce the increasing envelope levels.

To this end, the envelope detector of description herein, generates a convex upward decay response depicted by the first portion 28 and 26 of the curve of FIG. 3. The initial portion 28 of the curve is exaggerated for clarification. In particular, the voltage level of the decay response is held to within a selectable percentage drop of the initial input voltage level 10, for a selectable period of time 28, which herein has been selected as greater than the worst expected tape dropout interval. The level is maintained by detecting the increasing voltage difference, indicated by numerals 30, 32, FIG. 3, between the exponential decay voltage, i.e., curve 16, and the initial input voltage. As may be seen, the difference voltage increases along the time period 28 which, in turn, generates the increasing discharge current depicted as curve 34 in FIG. 3. The increasing discharge current controls the discharge of the capacitor to provide the convex upward output signal of the detector.

Referring now to FIG. 4, an amplitude modulated (AM) signal defines an initial voltage input at input 36, and is fed to ideal diode means 38 and to capacitor discharge control means 40. A capacitor 42 is coupled at junction 44 to the outputs of means 38 and 40, and thence to ground at 46. Junction 44 is coupled to output buffer means 48 which, in turn, provides the DC level output of the envelope detector via an output 50. The ideal diode means 38 does not generate a voltage drop and thus supplies the initial voltage input to the capacitor 42 while isolating the capacitor from the input 36. The capacitor discharge control means 40 provides an increasing discharge current for controlling the capacitor discharge via a capacitor discharge path 52 corresponding to the output thereof. The increasing discharge current corresponds to that of curve 34, FIG. 3. The output buffer means 48 provides means to isolate the capacitor 42 from the output 50, which is driven at the same voltage as that of the capacitor 42 by the buffer means 48.

FIG. 5 illustrates one implementation of the combination of FIG. 4, wherein like components are similarly numbered. Thus, the initial voltage input is fed from input 36 to a resistor/capacitor (RC) network 54 via an isolating ideal diode means 56. The RC network 54 is coupled to a buffer stage 60 formed of an operational amplifier, and thence to the negative input of a difference amplifier 62, which includes a resistor 64. Also included is a resistor 66 coupled across the amplifier 62, whose output is coupled to the positive input of a voltage follower operational amplifier 68. The output thereof is fed to the base of a current draining transistor 70, whose emitter is coupled back to the negative input of the voltage follower 68 and also to ground via a current resistor 72. The collector is coupled to the junction 44 and thus to the capacitor 42 of previous mention. A transistor 73 is coupled across the RC network to ground and provides means for initial resetting of the circuit. The drain transistor 70, resistor 72 and line 52 define the capacitor discharge path by which the capacitor 42 discharge is controlled. It follows that the components numbered 54–72 (and 82–86) define the capacitor discharge control means 40 previously depicted in FIG. 4.

The initial voltage input at 36 is also coupled to the positive input of an operational amplifier 74, whose output is coupled to the junction 44 and thus to the capacitor 42, via a diode 76 and resistor 78. The junction 44 is thence fed to the positive input of an output buffer operational amplifier 80 which provides the detected DC level signal on the output 50. The output 50 is coupled back to the negative inputs of the output buffer 80 and of the buffer 74, and thence to the positive input of the difference amplifier 62 via a line 82 and a resistor 84 thereof. The positive input is also coupled to ground via a resistor 86 of the amplifier 62. A transistor 88 is coupled from the positive input of the buffer 80 to ground and provides means for initially resetting the circuit.

It may be seen that the operational amplifier 74, diode 76 and resistor 78 define the ideal diode means 38, while the buffer operational amplifier 80 defines the output buffer means 48, previously depicted in FIG. 4.

In operation, successive pulses, such as generated as the momentary peaks of an amplitude modulated AC signal, are applied to the ideal diode means 38 and also to the RC network 54. The falling edge of a single pulse is depicted at 14 of FIG. 1 and defines the initial voltage input 10, wherein the single negative-going pulse 14 is used herein to define the circuit operation. It follows that the charging voltage at the junction 44 and thus on the capacitor 42, is the same as the initial input voltage at the input to the ideal diode means 38. In addition, the voltage at the output 50 is also the same as the voltage at junction 44. Thus, the voltage which appears on line 82, and thus at the positive input to the difference amplifier 62, is also the same as the voltage at junction 44.

The voltage at the negative input of the difference amplifier 62 is the exponential decay voltage generated via the RC network 54 (e.g, curve 16 of FIG. 1) in response to the negative-going edge of the single pulse. It follows that the output voltage of the difference amplifier 62 is the difference between the initial input voltage, i.e., line 82, and the exponential decay voltage from the buffer stage 60. As may be seen in FIG. 3, the difference voltage, i.e., indicated at 30, 32, is increasing, and accordingly the discharge current in line 52 due to the resistor 72 is likewise increasing (FIG. 3) for the selected time period 28. Thus, the capacitor 42 discharges as depicted by curve 26 of FIG. 3 as a convex upward decay curve rather than as an exponential, or concave upward decay curve as at 16. As the voltage of the RC network 54 continues to fall, the voltage difference continues to increase. Likewise the current continues to increase, until the decay finally assumes an approximate exponential curve with decreasing discharge current as depicted by portion 27 of the curve 26.

Assuming that $$\frac{R_{66}}{R_{64}} = \frac{R_{86}}{R_{84}} \quad (1)$$

And let $C_{54}R_{54}=k_2$ and $$C_{42}R_{72}\frac{R_{66}}{R_{64}} = k_1 \quad (2)$$

Then it may be shown mathematically that the response of the envelope detector of description herein to a unit negative step voltage at the input 36 will be $$V_{50} = \left(\frac{1}{k_1 - k_2}\right)(k_1 e^{-t/k_1} - k_2 e^{-t/k_2}) \quad (3)$$

And in the case when $K_1=K_2=K$ (4)

$$V_{50} = \left(1 + \frac{t}{k}\right) e^{-t/k} \quad (5)$$

The plot (not to scale) of the resulting curve 26 is depicted in the FIG. 3.

In the case when the input voltage defines a rising slope, i.e., a positive-going pulse, the output fully complies to it. Since the diode 76 is forward biased, the capacitors 42 and that of RC network 54 are then quickly charged to the corresponding voltage level.

In the event that an additional perfectly flat response is desired before the convex upward decay, a diode or a number of diodes in series, depicted by dashed box 89, may be inserted in the current discharge line 52 to delay the current drain for a corresponding delay time. Thereafter, the decay curve is essentially the same as described at 28 and 26 of FIG. 3.

FIG. 6 depicts an alternative, more sophisticated yet efficient, embodiment of the combination of FIG. 4, wherein like components of FIGS. 4, 5 and 6 are similarly numbered. Thus the initial voltage input at 36 is coupled to the ideal diode means 38, to the capacitor 42 and thence to the output buffer means 48. The input 36 is also fed to the capacitor discharge control means 40, which herein includes an isolating buffer operational amplifier 90 coupled via a diode 92 to the RC network 54. The RC network is coupled to the buffer operational amplifier 60, which is coupled to a current drain resistor 94 and thence to the junction 44 and capacitor 42. The resistor 94, in combination with the prior components, defines the means for generating the increasing current for controlling the discharge of the capacitor 42 as described above. Thus the difference in voltage between the initial voltage input at junction 44 and the exponential voltage at the output of buffer 60 is interpreted by the resistor 94, which also inherently converts the increasing voltage difference to an increasing discharge current in line 52. The diode 96/resistor 98 and the diode 100/resistor 102 of the operational amplifiers 90 and 74 respectively, are employed to prevent the amplifiers from going into negative saturation, and to isolate the respective second stage outputs 48, 60 from their first stage outputs, in generally conventional fashion.

The equations 3 and 5 in the first embodiment hold true also in this embodiment when $$k_1 = C_{42}R_{94} \text{ and } k_2 = C_{54}R_{54}. \quad (6)$$

A diode or a series of diodes 89 may also be added in the circuit of FIG. 6, as in FIG. 5, to provide an additional perfectly flat response for a selected time period.

The circuit of FIG. 7 provides a second order controlled decay envelope detector, and includes in essence the circuit of FIG. 6 with the addition of another stage of components. Like components are similarly numbered, with the components of the added stage 40a further including a lower case letter a. Thus, in essence, the output, i.e., the increasing discharge current of resistor 94a/line 52a is fed to the initial control stage, and particularly to an added junction 44' and capacitor 42' thereof. The refined discharge current is then coupled to the junction 44 via the resistor 94 and the discharge line 52. The second order circuit provides second order control of the discharge current, and thus the corresponding added precision in following the envelope level by more precisely controlling the discharge of the capacitor 42. More particularly, in response to a unit negative step voltage at 36, the DC voltage output at 50 in FIG. 7 is shown mathematically by $$V_{50} = \left[1 + \frac{t}{k} + \frac{t^2}{2k^2}\right] e^{-t/k} \quad (7)$$

When $R_{54a}C_{54a}=R_{94a}C_{42'}=R_{94}C_{42}=k$ (8)

A third order controlled decay envelope detector is contemplated by the invention combination, wherein another stage of control is added to provide the still further precision of a third order function.

What is claimed is:

1. An envelope detector for generating a DC level representing the amplitude of the envelope of an amplitude modulated input signal comprising;
    means for supplying the input signal as a charging signal;
    capacitor means responsive to the charging signal; and
    discharge control means for providing an increasing discharge current through a discharge path for said capacitor means for a selected time period of the input signal.

2. The detector of claim 1 wherein the input signal is a succession of positive-going and negative-going edges wherein;
    the capacitor means is charged by each positive-going edge, and is discharged with a convex upward decay by the increasing discharge current in response to each negative-going edge.

3. The detector of claim 2 wherein the discharge control means includes;
    an RC network for generating an exponential concave upward decay voltage in response to the negative-going edge; and means coupled to the RC network for generating the voltage difference between the capacitor voltage and the exponential decay voltage.

4. The detector of claim 3 wherein;

the means for supplying includes first ideal diode means for supplying the charging voltage commensurate with the input signal; and the detector further includes output buffer means for driving the detector output at the same voltage as that of the capacitor means.

5. The detector of claim 4 further including;

difference amplifier means operatively coupled to the RC network and to the output buffer means to generate the voltage difference; and current drain means coupled to the difference amplifier means for providing the increasing discharge current path in response to the difference amplifier.

6. The detector of claim 5 wherein the current drain means further includes;

a transistor disposed in the discharge current path; and a resistor coupled to the transistor and responsive thereto to define the path.

7. The detector of claim 4 wherein the means for generating the voltage difference and the increasing discharge current comprises;

first resistor means operatively coupled from the RC network to the capacitor means.

8. The detector of claim 7 further including;

isolating buffer means coupled to the input signal, said RC network being coupled to the isolating buffer means;

second output buffer means coupled to the RC network;

second capacitor means operatively coupled between the RC network and the first resistor means;

second resistor means coupled from the second output buffer means to the second capacitor means.

9. The detector of claim 4 further including;

diode means disposed in the increasing current discharge path to delay the discharge of the capacitor means for a selected delay interval.

* * * * *